(12) United States Patent
Farnworth

(10) Patent No.: US 7,768,040 B2
(45) Date of Patent: Aug. 3, 2010

(54) IMAGER DEVICE WITH ELECTRIC CONNECTIONS TO ELECTRICAL DEVICE

(75) Inventor: Warren Farnworth, Nampa, ID (US)

(73) Assignee: Micron Technology, Inc., San Jose, CA (US)

( * ) Notice: Subject to any disclaimer, the term of this patent is extended or adjusted under 35 U.S.C. 154(b) by 554 days.

(21) Appl. No.: 11/551,899

(22) Filed: Oct. 23, 2006

(65) Prior Publication Data

US 2008/0093613 A1 Apr. 24, 2008

(51) Int. Cl.
*H01L 27/146* (2006.01)
(52) U.S. Cl. .................. 257/222; 257/294; 257/234
(58) Field of Classification Search .................. 257/79, 257/222, 234, 291, 294
See application file for complete search history.

(56) References Cited

U.S. PATENT DOCUMENTS

| | | | | |
|---|---|---|---|---|
| 6,800,943 | B2 * | 10/2004 | Adachi | 257/777 |
| 2005/0205898 | A1 * | 9/2005 | Van Arendonk et al. | 257/222 |
| 2005/0275048 | A1 * | 12/2005 | Farnworth et al. | 257/431 |
| 2005/0285154 | A1 * | 12/2005 | Akram et al. | 257/234 |
| 2006/0043262 | A1 | 3/2006 | Akram | 250/208.1 |
| 2006/0289052 | A1 * | 12/2006 | O'Quinn et al. | 136/230 |
| 2007/0102622 | A1 * | 5/2007 | Olsen et al. | 250/208.1 |

* cited by examiner

*Primary Examiner*—Howard Weiss
*Assistant Examiner*—Tifney L Skyles
(74) *Attorney, Agent, or Firm*—Dickstein Shapiro LLP

(57) ABSTRACT

An imager device is disclosed including a first substrate having an array of photo-sensitive elements formed thereon, a first conductive layer formed above the first substrate, a first conductive member extending through the first substrate, the first conductive member being conductively coupled to the first conductive layer, a standoff structure formed above the first substrate, a second conductive layer formed above the standoff structure, the second conductive layer being conductively coupled to the first conductive layer, and an electrically powered device positioned above the standoff structure, the electrically powered device being electrically coupled to the second conductive layer. A method of making an imager device is disclosed including providing a first substrate having a first conductive layer and an array of photosensitive elements formed above the first substrate, forming a conductive member that extends through the first substrate and is conductively coupled to the first conductive layer, forming a standoff structure above the first substrate, forming a patterned conductive layer above the standoff structure, the patterned conductive layer being conductively coupled to the first conductive layer, and conductively coupling an electrically powered device to the patterned conductive layer positioned above the standoff structure.

18 Claims, 5 Drawing Sheets

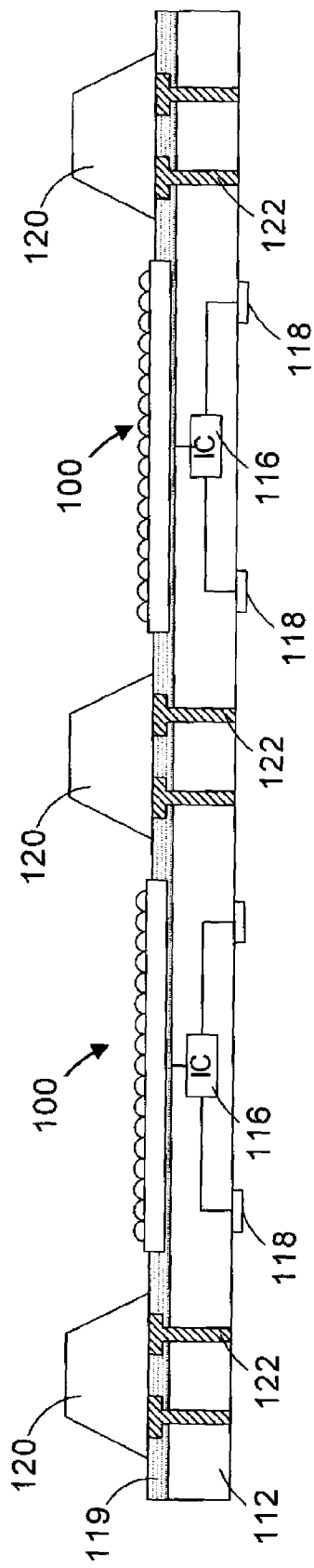
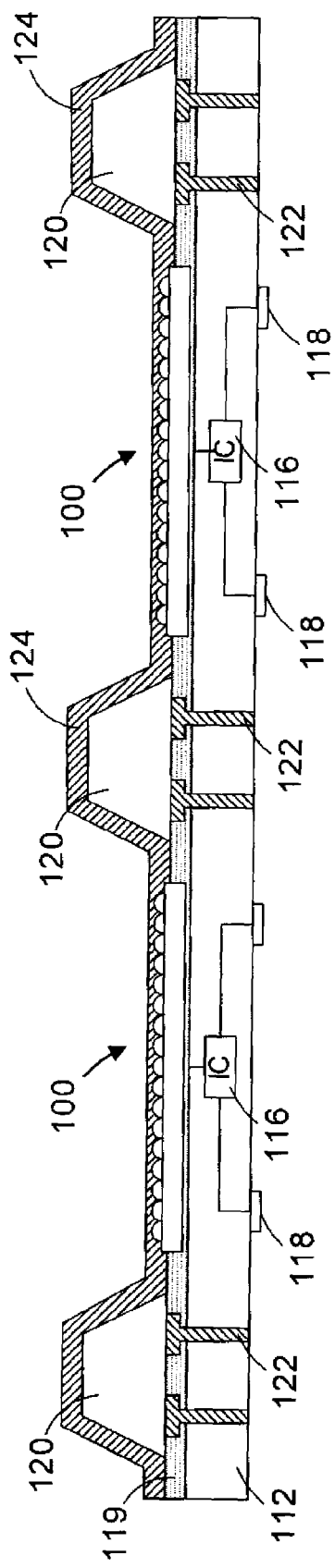
Figure 2
Figure 3

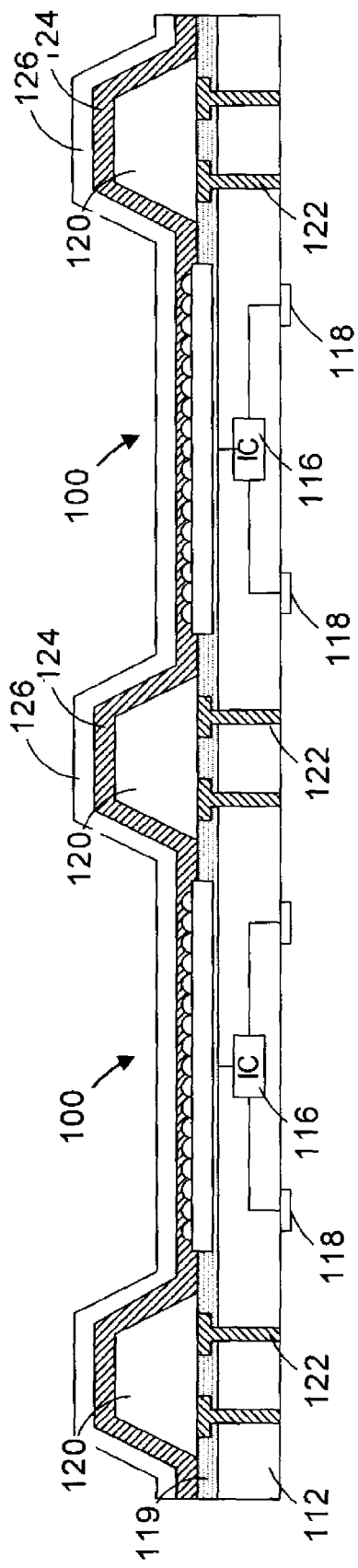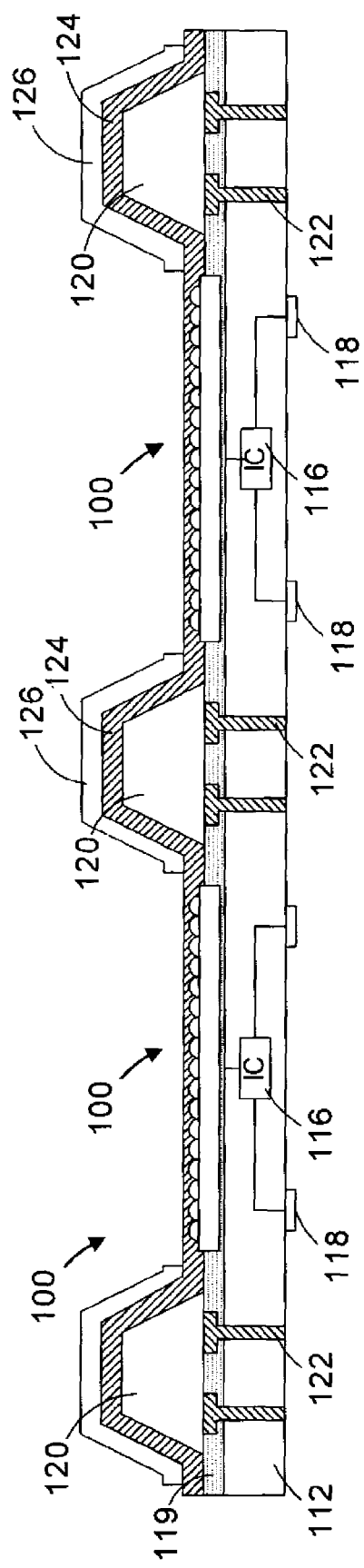

IMAGER DEVICE WITH ELECTRIC CONNECTIONS TO ELECTRICAL DEVICE

BACKGROUND OF THE INVENTION

1. Field of the Invention

The present invention is generally directed to the field of microelectronic imager devices and methods of manufacturing such devices.

2. Description of the Related Art

Microelectronic imagers are used in digital cameras, wireless devices with picture capabilities, and many other applications. Cell phones and Personal Digital Assistants (PDAs), for example, are incorporating microelectronic imagers for capturing and sending pictures. The growth rate of microelectronic imagers has been steadily increasing as they become smaller and produce better images with higher pixel counts.

Microelectronic imagers include image sensors that use Charged Coupled Device (CCD) systems, Complementary Metal-Oxide Semiconductor (CMOS) systems, or other systems. CCD image sensors have been widely used in digital cameras and other applications CMOS image sensors are also quickly becoming very popular because of their relative lower production costs, higher yields and smaller sizes. CMOS image sensors can provide these advantages because they are manufactured using technology and equipment developed for fabricating semiconductor devices. CMOS image sensors, as well as CCD image sensors, are accordingly "packaged" to protect the delicate components and to provide external electrical contacts.

FIG. 1 is a schematic view of a conventional microelectronic imager 1 with a conventional package. The imager 1 includes a die 10, an interposer 20 attached to the die 10 and a housing 30 attached to the interposer 20. The housing 30 surrounds the periphery of the die 10 and has an opening 32. The imager 1 also includes a transparent cover 40 over the die 10.

The die 10 includes an array of image sensors 12 and a plurality of bond pads 14 that are electrically coupled to the array of image sensors 12. The interposer 20 is typically a dielectric fixture having a plurality of bond pads 22, a plurality of ball pads 24 and traces 26 electrically coupling bond pads 22 to corresponding ball pads 24. The ball pads 24 are arranged in an array for surface mounting the imager 1 to a printed circuit board or module of another device. The bond pads 14 on the die 10 are electrically coupled to the bond pads 22 on the interposer 20 by wire bonds 28 to provide electrical pathways between the bond pads 14 and the ball pads 24. The interposer 20 can also be a lead frame or ceramic housing.

The imager 1 shown in FIG. 1 also has an electrically powered device 40 attached to the housing 30. The electrically powered device 30 may perform a variety of functions, e.g., an electrically powered optics unit, etc. Typically, electrical connections to such an electrically powered device 40 are provided by means of conductive straps or traces 42 that are bonded to external pads 44, 46 formed on the interposer 20 and the electrically powered device 40. An insulating layer 43 may also be provided. Such electrical connections to an electrically powered device 40 are time-consuming to manufacture, and are susceptible to damage during use.

The present invention is directed to a device and various methods that may solve, or at least reduce, some or all of the aforementioned problems.

BRIEF DESCRIPTION OF THE DRAWINGS

The invention may be understood by reference to the following description taken in conjunction with the accompanying drawings, in which like reference numerals identify like elements, and in which:

FIG. 2 is a sectional view of a schematically depicted imager device in accordance with one illustrative aspect of the present invention in an initial stage of fabrication;

FIG. 3 depicts the formation of a layer of conductive material above the structure depicted in FIG. 2;

FIG. 4 depicts the formation of a masking layer above the structure depicted in FIG. 3;

FIG. 5 depicts the structure shown in FIG. 4 after the masking layer has been patterned to form a patterned masking layer;

Figure 1:
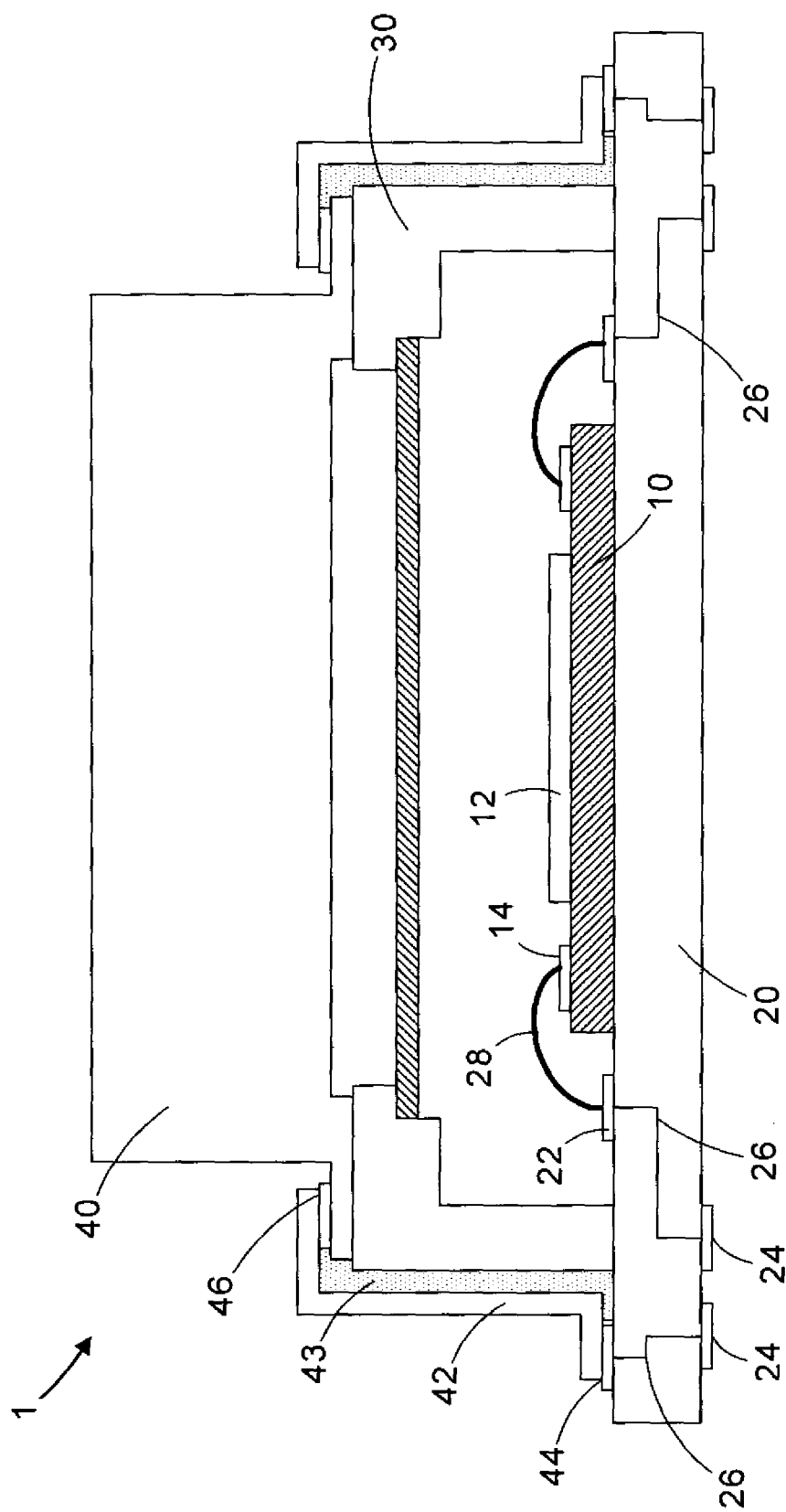
FIG. 1 is a schematic depiction of an illustrative prior art imager device.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. For purposes of clarity and explanation, the relative sizes of the various features depicted in the drawings may be exaggerated or reduced as compared to the actual size of those features or structures. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be explicitly set forth in the specification in a definitional manner that directly and unequivocally provides the special definition for the term or phrase.

FIG. 2 depicts a plurality of illustrative CMOS imager devices 100 formed on a substrate 112. The substrate 112 may be any of a variety of materials, e.g., silicon, silicon germanium, an SOI structure, etc. The imager devices 100 may be formed in accordance with processing techniques that are well known to those skilled in the art. The imager device 100 typically comprises an array of photosensitive elements 114, internal circuitry 116 and bond pads 118. The bond pads 118 are adapted to be electrically coupled to another structure, such as a printed circuit board (not shown).

A plurality of standoff structures 120 are formed above the substrate 112. The standoff structures 120 may be formed by a variety of known techniques, and they may be made from a variety of materials, such as silicon, silicon dioxide, polymer, glass, etc. The size and configuration of the standoff structures 120 may vary depending upon the particular application.

A conductive layer 119 is formed above the substrate 112. The conductive layer 119 may be comprised of a variety of materials, e.g., aluminum, titanium, copper, nickel, etc. The conductive layer 119 may be representative of a layer that covers substantially the entire substrate 112 or a conductive trace that is part of a patterned conductive layer. The conductive layer 119 may have a thickness ranging from approximately 100-300 Å up to several micrometers, and it may be formed by performing a variety of known deposition techniques, e.g., a sputter deposition process, a plating process, etc.

Also depicted in FIG. 2 are a plurality of conductive members 122 that extend through the substrate 112. Such conductive members 122 are sometimes referred to as through-wafer interconnects. These conductive members 122 may be formed using known techniques and materials. The conductive members 122 conductively engage the conductive layer 119. The size and configuration of the conductive members 122 may vary depending upon the particular application.

Next, as shown in FIG. 3, in one illustrative embodiment, a layer of conductive material 124 is deposited on the structure shown in FIG. 2. The layer of conductive material 124 may be comprised of any of a variety of conductive materials, e.g., platinum, gold, titanium-aluminum, copper, copper-nickel, etc., and its thickness may vary from approximately 100-20,000 Å depending on the particular application. The layer of conductive material 124 may be formed by performing a variety of known deposition processes, e.g., a physical or chemical vapor deposition process, sputtering, a plating process, etc. In one particularly illustrative embodiment, the layer of conductive material 124 is a layer of titanium-aluminum having a thickness of approximately 10,000-20,000 Å that is formed by a physical vapor deposition process.

Then, as shown in FIG. 4, a masking layer 126 is formed above the layer of conductive material 124. The masking layer 126 may be made from a variety of materials and it may be formed by a variety of processes. In one illustrative embodiment, the masking layer 126 is a layer of electrophoretic resist material that may be formed using a bath-like plating process. In other embodiments, the masking layer 126 may be a traditional photoresist material may be formed by traditional spin-coating techniques.

As shown in FIG. 5, the masking layer 126 is patterned to thereby expose portions of the underlying layer of conductive material 124. The masking layer 126 may be patterned using a variety of techniques, which may vary depending on the materials used for the layer 26. In the case where the masking layer 26 is comprised of a traditional photo-masking resist or electrophoretic resist, traditional exposure and development processes may be used to pattern the masking layer 26.

Figure 6:
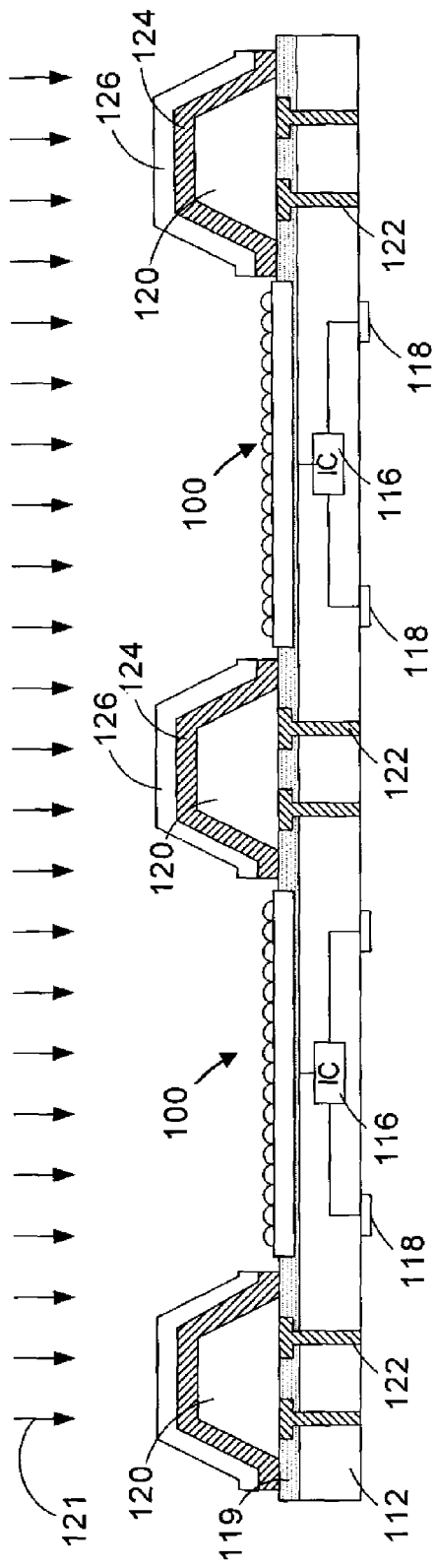
FIG. 6 depicts the structure shown in FIG. 5 after the conductive layer has been patterned.

Thereafter, as shown in FIG. 6, one or more etching processes 121 may be performed to remove the exposed portions of the layer of conductive material 124. A variety of etching techniques and processes may be performed to remove the exposed portions of the conductive layer of material 124. For example, an anisotropic plasma enhanced etching process may be performed to pattern the layer of conductive material 124. The patterned masking layer 126 may then be removed or stripped using a traditional ashing process or a dilute acid bath. Alternatively, a wet etching process may be used.

Figure 7:
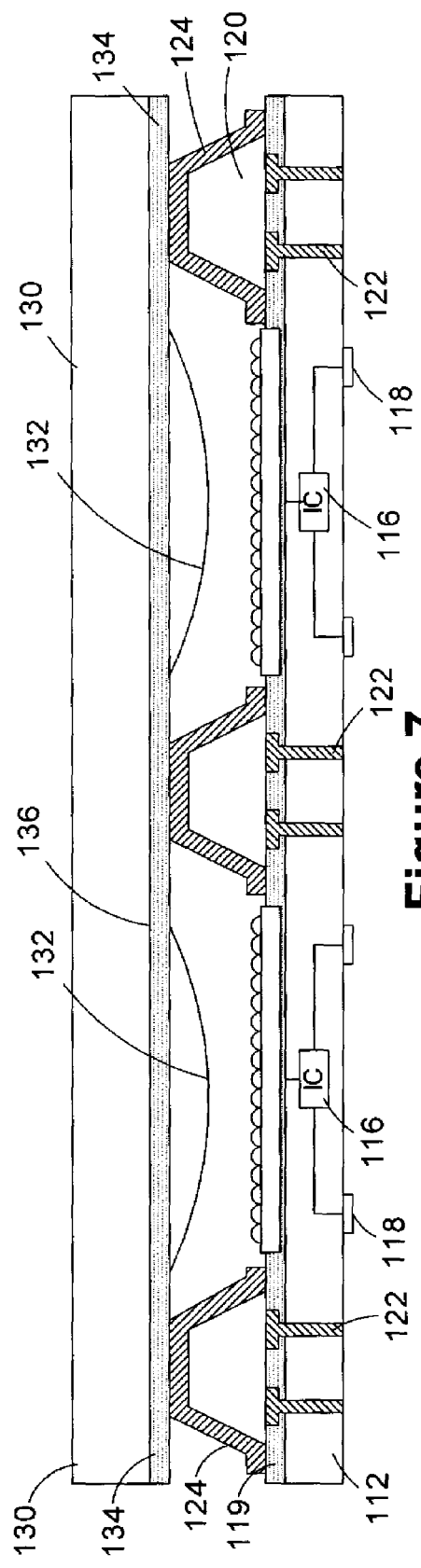
FIG. 7 depicts an electrically powered component positioned above and electrically coupled to the structure shown in FIG. 6.

Next, as shown in FIG. 7, a substrate 130 comprised of a plurality of electrically powered devices 132 is positioned above and secured to the device. A conductive layer 134 is formed on the bottom surface 136 of the substrate 130. The conductive layer 134 may be representative of a layer that covers substantially the entire substrate 130 or a conductive trace that is part of a patterned conductive layer. The conductive layer 134 is conductively coupled to the patterned conductive layer 124 by a variety of known techniques, e.g., a conductive adhesive material. As thus configured, a conductive path comprising the conductive member 122 (in the substrate 112), the conductive layer 119, the patterned conductive layer 124 (above the standoff 120) and the conductive trace or layer 134 is established. Electrical power may be supplied to the electrically powered devices 132 via this conductive path. In one illustrative example, the electrically powered devices 132 are electrically powered optical devices, e.g., an electrically powered lens. In other embodiments, the electrically powered devices 132 may simply be an adjustable aperture, filter or light source. Thus, the electrically powered devices 132 are schematic in nature in that they reflect any electrically powered device or structure that may affect the quality, quantity or characteristic of light intended to be projected onto or received by the imaging devices 100.

The substrate 130 may be comprised of a variety of materials. In some cases, the substrate 130 may be comprised of glass or other material that allows the transmission of light to the imaging device 100. The exact nature and properties of the substrate 130 may vary depending on the particular application.

Figure 8:
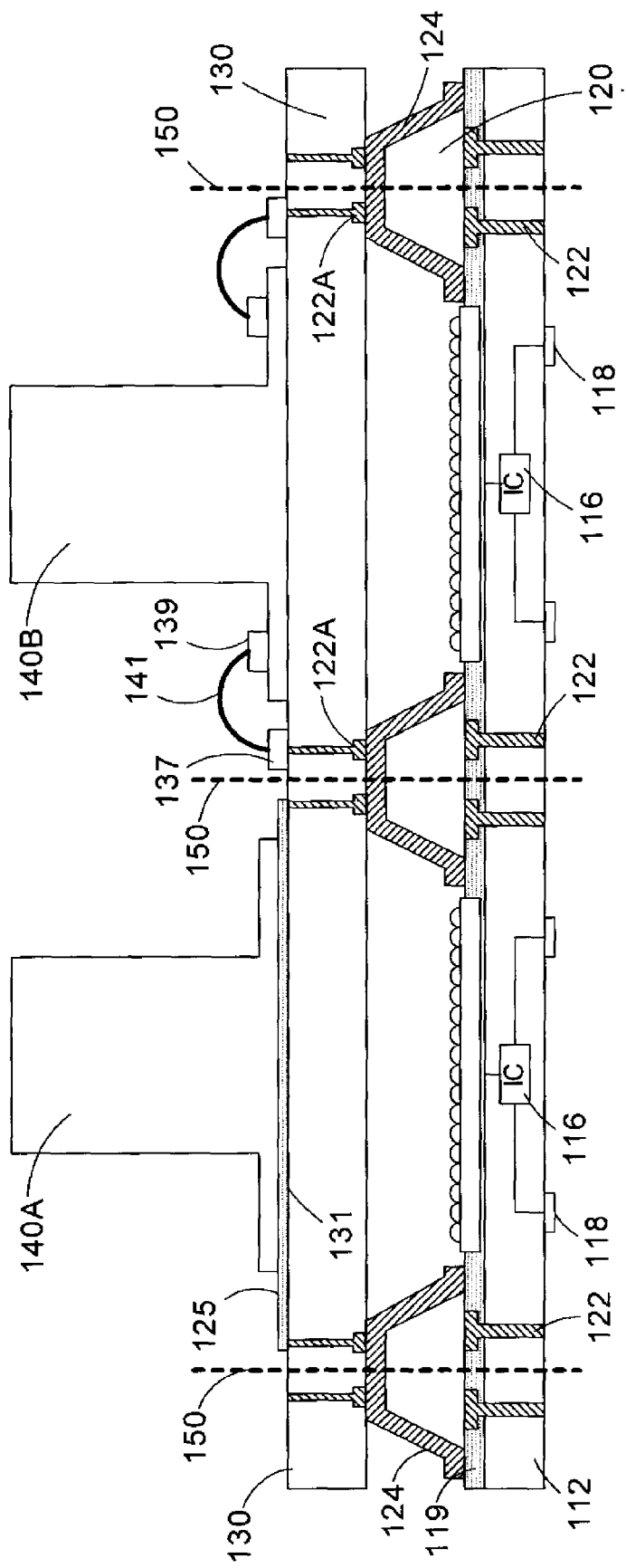
FIG. 8 depicts another illustrative embodiment of an electrically powered device positioned above the imager device.

FIG. 8 depicts an alternative embodiment of the present invention wherein a conductive path may be established through the substrate 130 to provide electrical power to schematically depicted electrically powered devices 140A and 140B positioned above the substrate 130. For example, in one embodiment, the electrically powered devices 140A, 140B may be an electrically powered lens. In one embodiment, illustrative conductive members 122A, e.g., through-wafer interconnects, may be formed in the substrate 130 using traditional techniques. The size and shape of the conductive members 122A may vary depending upon the particular application.

Thereafter, with respect to the imager device 100 on the left side of FIG. 8, a conductive layer 125 may be formed above the surface 131 of the substrate 130. The conductive layer 125 may be representative of a layer that covers substantially the entire substrate 130 or a conductive trace that is part of a patterned conductive layer. The schematically depicted electrically powered device 140A may be conductively coupled to the conductive layer 125 using a variety of known techniques, e.g., a conductive adhesive material. The right side of FIG. 8 depicts an alternative arrangement wherein bond pads 137 are formed on the surface 131 of the substrate 130 and thereby conductively coupled to the conductive members 122A. Bond pads 139 are also formed on the electrically powered device 140B. Traditional wire bonds 141 are employed to conductively coupled the pads 137, 139 to one another.

At some desired point in the manufacturing process, the individual devices 100 may be cut along the illustrative cut lines 150 to separate the individual integrated circuit devices. At that point, the separated devices may be packaged using traditional techniques.

As will be recognized by those skilled in the art after a complete reading of the present application, the present invention provides a novel way to provide electrical power to an electrically powered device positioned above the imager device 100. For example, where the substrate 130 comprises an electrically powered focus device, such as the electrically powered lens 132 depicted in FIG. 7, the present invention allows electrical power to be supplied to the lens 132 without the need for cumbersome and problematic bonding wire. More specifically, in the illustrative embodiment depicted in FIG. 7, the conductive path is defined by the conductive member 122, the conductive layer 119, the conductive layer portion 124 and the conductive trace or layer 134.

The present invention may also be employed to supply electrical power to any of a variety of different electrically powered devices that are positioned above (not necessarily over) the imager device 100. FIG. 8 illustratively depicts such a situation wherein the substrate 130 is a protective glass cover. Additional standoffs may be provided if required. Conductive members 122A may be formed through the substrate 130 to thereby extend the conductive path vertically to a schematically depicted electrical component or device 140A, 140B. The substrate 130 depicted in FIG. 7 with its associated components may also be considered to be one type of an electrical component or device.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An imager device, comprising:
    a first substrate comprising an array of photosensitive elements formed thereon;
    a first conductive material formed above the first substrate;
    a first conductive member extending through the first substrate, the first conductive member being conductively coupled to the first conductive material;
    a standoff structure formed above the first substrate;
    a second conductive material formed above and on a surface of the standoff structure, the second conductive material being conductively coupled to the first conductive material and being arranged such that it is on a side of the standoff structure closest to the array of photosensitive elements; and
    an electrically powered device positioned above the standoff structure, the electrically powered device being electrically coupled to the second conductive material.

2. The device of claim 1, wherein the first conductive material is formed on a surface of the first substrate.

3. The device of claim 1, wherein the first conductive member is a through-wafer interconnect structure.

4. The device of claim 1, wherein the standoff structure is positioned above and vertically aligned with the first conductive member.

5. The device of claim 1, wherein the electrically powered device comprises at least one of an electrically powered lens, an electrically powered aperture, an electrically powered filter and an electrically powered light.

6. The device of claim 1, wherein the first substrate comprises at least one of silicon, silicon germanium and an SOI structure.

7. The device of claim 1, wherein the first conductive material comprises at least one of aluminum, titanium, copper and nickel.

8. The device of claim 1, wherein the second conductive material comprises at least one of platinum, gold, titanium-aluminum, copper and copper-nickel.

9. The device of claim 1, further comprising a third conductive material that conductively couples the electrically powered device to the second conductive material.

10. The device of claim 1, further comprising a second substrate and third conductive material formed on the second substrate, the third conductive material being conductively coupled to the second conductive material and the electrically powered device.

11. The device of claim 1, further comprising a second substrate having a second conductive member that extends through the second substrate, the second conductive member being conductively coupled to the second conductive material.

12. The device of claim 1, further comprising a third conductive material that conductively couples the electrically powered device to the second conductive material.

13. The device of claim 1, further comprising a second substrate and third conductive material formed on the second substrate, the third conductive material being conductively coupled to the second conductive material and the electrically powered device.

14. The device of claim 1, further comprising a second substrate having a second conductive member that extends through the second substrate, the second conductive member being conductively coupled to the second conductive material.

15. An imager device, comprising:
    a first substrate comprising an array of photosensitive elements formed thereon;
    a first conductive material formed on the first substrate;
    a first conductive member extending through the first substrate, the first conductive member being conductively coupled to the first conductive material;
    a standoff structure formed above the first conductive member;
    a second conductive material formed above and on a surface of the standoff structure, the second conductive material being conductively coupled to the first conductive material and being arranged such that it is on a side of the standoff structure closest to the array of photosensitive elements; and
    an electrically powered device positioned above the standoff structure, the electrically powered device being electrically coupled to the second conductive material.

16. The device of claim 15, wherein the first conductive member is a through-wafer interconnect structure.

17. The device of claim 1, wherein at least a portion of the second conductive material is in contact with the first conductive material.

18. The device of claim 15, wherein at least a portion of the second conductive material is in contact with the first conductive material.

* * * * *